United States Patent [19]
Imataki et al.

[11] Patent Number: 5,391,885
[45] Date of Patent: Feb. 21, 1995

[54] METHOD OF DETECTING AND ANALYZING DEFECTIVE PORTION OF SEMICONDUCTOR ELEMENT AND APPARATUS FOR DETECTING AND ANALYZING THE SAME

[75] Inventors: Tomoo Imataki, Kita-Katsuragi; Mamoru Suzuki, Yamato-Koriyama, both of Japan

[73] Assignee: Sharp Kabushiki Kaisha, Osaka, Japan

[21] Appl. No.: 866,044

[22] Filed: Apr. 10, 1992

[30] Foreign Application Priority Data

Apr. 26, 1991 [JP] Japan .................... 3-097717

[51] Int. Cl.⁶ ............................. G01N 21/66
[52] U.S. Cl. ................ 250/492.2; 250/491.1; 356/237
[58] Field of Search ............... 356/237, 394; 250/462.1, 491.1, 492.2; 364/489, 488, 552; 382/8

[56] References Cited

U.S. PATENT DOCUMENTS

| | | | |
|---|---|---|---|
| 4,659,220 | 4/1987 | Bronte et al. | 356/237 |
| 4,755,874 | 7/1988 | Esrig et al. | 358/106 |
| 4,811,090 | 3/1989 | Khurana | 358/93 |
| 4,872,052 | 10/1989 | Liudzius et al. | 358/106 |
| 5,006,717 | 4/1991 | Tsutsu et al. | 250/484.1 |

FOREIGN PATENT DOCUMENTS

0305644  3/1989  European Pat. Off. .
64-52113 2/1989  Japan .

OTHER PUBLICATIONS

*Patent Abstracts of Japan*, vol. 13, No. 256 (14 Jun. 1989 & JP-A-10 53 157 (Shiseido) 1 Mar. 1989 Abstract EPO Search Report.
Patent Abstracts of Japan–"Method and Device For Microscope Image Measurement" 1–52113(A). Feb. 1989.

*Primary Examiner*—Paul M. Dzierzynski
*Assistant Examiner*—David V. Bruce
*Attorney, Agent, or Firm*—Nixon & Vanderhye

[57] ABSTRACT

A method of detecting a defective portion of a semiconductor element, includes the steps of: setting a semiconductor element on a stage of an emission microscope; setting a magnification of the emission microscope low and observing a surface of the semiconductor element by the emission microscope while an electric power is supplied to the semiconductor element; storing a positional information of at least one light emission portion of the semiconductor element observed by the emission microscope; moving the stage on the basis of the stored positional information so that one light emission portion is moved to a view center of the emission microscope; increasing the magnification and collecting a light emission image of one light emission portion by the emission microscope; and moving the stage on the basis of the stored positional information so that another light emission portion is moved to the view center so as to collect a light emission image of another light emission portion by the emission microscope.

15 Claims, 10 Drawing Sheets

METHOD OF DETECTING AND ANALYZING DEFECTIVE PORTION OF SEMICONDUCTOR ELEMENT AND APPARATUS FOR DETECTING AND ANALYZING THE SAME

BACKGROUND OF THE INVENTION

1. Field of the Invention

The present invention relates to a method of detecting and analyzing a defective portion of a semiconductor element, and more particularly, a method of detecting and analyzing a defective portion by means of an emission microscope. The present invention also relates to an apparatus for detecting and analyzing the same.

2. Description of the Related Arts

The manufacture of a semiconductor device are performed such that semiconductor elements such as a transistor, a resistor, a diode, etc., are formed as quite fine patterns at a small area of a semiconductor substrate, and that the formed semiconductor elements are electrically connected by wiring techniques so as to accomplish a desirable circuit function of the semiconductor device.

In this kind of semiconductor device, attempts are made to make the patterns finer and also make the electric consumption current lower, in the development in the semiconductor technology, so as to improve the integration. However, this improvement of the integration has the drawback of difficulty in detecting a defect within the semiconductor device. Namely, since a leak current due to a defect to be detected, becomes quite weak in proportion to such pattern reduction and consumption current lowering, the accuracy of the detection is apt to be degraded by the noise etc., of the detection device.

In order to overcome such a drawback and detect such a small leak current by higher sensitivity, there is a method of detecting such a defective portion by use of an emission microscope, which detects a small amount of light emitted from the defective portion.

This detecting and analyzing method by use of the emission microscope is conducted as following. Namely, at first the semiconductor device to be examined is set on a stage of the emission microscope to which an image processing apparatus is connected, in such a condition that the semiconductor device can be supplied with an external electric current. An objective lens having the minimum magnification, is set. The pattern image of the semiconductor element is stored into a first memory included in the image processing apparatus.

Then, the electric voltage is applied to the semiconductor element so that the symptom of the defect appears. The small amount of light emitted from the defective portion of the semiconductor element, is detected by the emission microscope, and the emitted light is integrated for a predetermined time period, and the integration result is stored into the second memory.

Then, the data in the first memory and the data in the second memory are read out therefrom, overlapped with each other by the image processing apparatus and displayed on a monitor. At this time, if necessary, the displayed image is outputted to a hardcopy apparatus and recorded by the hardcopy apparatus.

Then, the light emission portion detected in the above detecting operation, is placed to the center of the stage of the emission microscope. The objective lens having a higher magnification, is set in the emission microscope.

The above described processes from the data storing process into the first memory, to the objective lens setting process, are repeated until a desirable magnification for the pertinent light emission portion is obtained.

If there are a plurality of light emission portions, the whole process from setting the minimum magnification objective lens, is repeated until the detection processes are completed for all of the light emission portions.

In this manner, the defective portions can be detected and analyzed by use of the leak current caused in the semiconductor element, according to this detecting technique by means of the emission microscope.

In the above described defective portion detecting and analyzing method, however, the process of placing the light emission portion to the center of the stage of the emission microscope, is manually performed by the operator for each necessary occasion, which results in increases of the operation time and the labor of the operator. Particularly, since the light emission portion to be examined can be easily lost during the operation of changing the magnification, the increases of these time and labor of the operator are serious.

Further, according to the above described detecting method, in case that a plurality of light emission portions exist on one semiconductor substrate, since it is necessary to reset the magnification to its minimum value for each light emission portion in order to check its position, the time required to determine the defective portion becomes quite long.

Furthermore, according to the above described detecting and analyzing method of the related art, the recognition of the light emission portion depends on the observer as he distinguishes a plurality of light emission portions from the noises in the observed image, which is basically formed by integrating the emitted lights during a certain time period. Accordingly, the detection result of the defective portion depends on the skill of the observer, and there is a high possibility that the observed light emission portion, is incorrect, due to the mistake of the observer based on the noises of the emission microscope. In this manner, the difference in the observation result due to the individual variations, is a problem in this kind of detecting and analyzing method. This further leads to such a problem that the working load on the observer accompanied with the aforementioned troublesome movement of the stage of the emission microscope as well as the time required to perform the detection, is increased, while this time consuming and troublesome detecting operation itself causes the secondary defect in the tested object i.e. the semiconductor substrate, which is an essentially delicate article. On the other hand, the fact that the observed image is actually formed by integrating the emitted lights during the certain time period in the emission microscope, makes it difficult to perform an automatic detecting and analyzing procedure.

SUMMARY OF THE INVENTION

It is therefore a first object of the present invention to provide a method of detecting a defective portion of a semiconductor element, in which the detection can be easily performed with a reduced operation time and effort.

It is a second object of the present invention to provide a detecting apparatus to automatically perform the detecting method of the present invention.

It is a third object of the present invention to provide a method of analyzing a defective portion of a semiconductor element, in which the detection of the defective portion can be automatically performed to obtain an objective result.

It is a fourth object of the present invention to provide an analyzing apparatus to automatically perform the analyzing method of the present invention.

According to the present invention, the above mentioned first object can be achieved by a method of detecting a defective portion of a semiconductor element, including the steps of: setting a semiconductor element on a stage of an emission microscope; setting a magnification of the emission microscope low and observing a surface of the semiconductor element by the emission microscope while an electric power is supplied to the semiconductor element; storing a positional information of at least one light emission portion of the semiconductor element observed by the emission microscope; moving the stage on the basis of the stored positional information so that one light emission portion is moved to a view center of the emission microscope; increasing the magnification and collecting a light emission image of one light emission portion by the emission microscope; and moving the stage on the basis of the stored positional information so that another light emission portion is moved to the view center so as to collect a light emission image of another light emission portion by the emission microscope.

According to the above mentioned detecting method of the present invention; the large surface area, or the whole surface area for example, of the semiconductor element such as a LSI (Large Scale Integrated circuit) chip, can be observed at the observing step since the magnification of the emission microscope is set low at this step. Here, the positional information, such as coordinate data, of a plurality of light emission portions can be observed and stored, in advance to the emission light image collecting step. Then, since the stage is moved on the basis of thus stored positional information so that each observed light emission portion is moved to the view center of the emission microscope, the emission light image of each light emission portion can be collected without searching each light emission portion. At this time, the light emission portion can be positioned at the center of the collected image. And then the desirably magnified image can be obtained since the magnification of the emission microscope is increased at this step.

Consequently, the detection of the defective portion of the semiconductor element, can be easily and automatically performed with a reduced operation time i.e. without time to search each light emission portion at the increased magnification etc., and with an reduced effort or labor of the operator, according to the present invention.

According to the present invention, the above mentioned second object can be achieved by an apparatus for detecting a defective portion of a semiconductor element, provided with; a movable stage on which a semiconductor element is set; an electric source for supplying an electric power to the semiconductor element; and an emission microscope, which magnification is changeable, for observing a surface of the semiconductor element and collecting an image of the semiconductor element. The apparatus is also provided with a control device for directing the emission microscope to observe the surface of the semiconductor element with setting the magnification low while the electric source supplies the electric power, storing a positional information of at least one light emission portion observed by the emission microscope, directing the stage to move on the basis of the stored positional information so that one light emission portion is moved to a view center of the emission microscope, directing the emission microscope to increase the magnification and collect a light emission image of one light emission portion, directing the stage to move on the basis of the stored positional information so that another light emission portion is moved to the view center, and directing the emission microscope to collect another light emission image of another light emission portion.

According to thus constructed detecting apparatus of the present invention, the above mentioned detecting method of the present invention can be automatically performed.

According to the present invention, the above mentioned second object can be achieved by a method of analyzing a defective portion of a semiconductor element, including the steps of: setting a semiconductor element to an emission microscope; collecting a light emission image of a light emission portion of the semiconductor element by the emission microscope with a certain amount of noise while an electric power is supplied to the semiconductor element, so as to generate image data corresponding to the collected light emission image and the noise; and inputting the generated image data to a processing device. The analyzing method also includes the step of recognizing the light emission portion by distinguishing image data corresponding to the light emission portion from image data corresponding to the noise, by the processing device.

According to the analyzing method of the present invention, the semiconductor element is set to an emission microscope. Then, the emission microscope collects a light emission image of a light emission portion of the semiconductor element, with a certain amount of noise, which depends on the magnification, specification and various conditions of the emission microscope, while an electric power is supplied to the semiconductor element. Then, the emission microscope generates the image data corresponding to the collected light emission image and the noise. At this time, the processing device, such as a computer, recognizes the light emission portion by distinguishing the image data corresponding to the light emission portion from image data corresponding to the noise. Thus, the defective portion can be detected and analyzed as the light emission portion free from the influence of the noises of the emission microscope. Accordingly, the difference in the detection result due to the individual variations is made quite little or nil, and the possibility to miss or overlook the light emission portion is also made little, so that the objective result of analysis can be automatically and speedily obtained.

According to the present invention, the above mentioned fourth object can be achieved by an apparatus for analyzing a defective portion of a semiconductor element. The analyzing apparatus is provided with: a movable stage on which a semiconductor element is set; an electric source for supplying an electric power to the semiconductor element; and an emission microscope, which magnification is changeable, for collecting an image of the semiconductor element and generating image data corresponding to the collected image. The analyzing apparatus is also provided with a computer, to which the generated image data are inputted, having a memory device for statistically processing the inputted image data, and controlling the position of the movable stage and the magnification of the emission microscope according to the result of statistical process.

According to thus constructed analyzing apparatus of the present invention, the above mentioned analyzing method of the present invention can be automatically performed.

Further objects and advantages of the present invention will be apparent from the following description of the preferred embodiment of the invention as illustrated in the accompanying drawings.

DETAILED DESCRIPTION OF THE PREFERRED EMBODIMENT

A preferred embodiment of the present invention will be described below with reference to the accompanying drawings.

Figure 1:
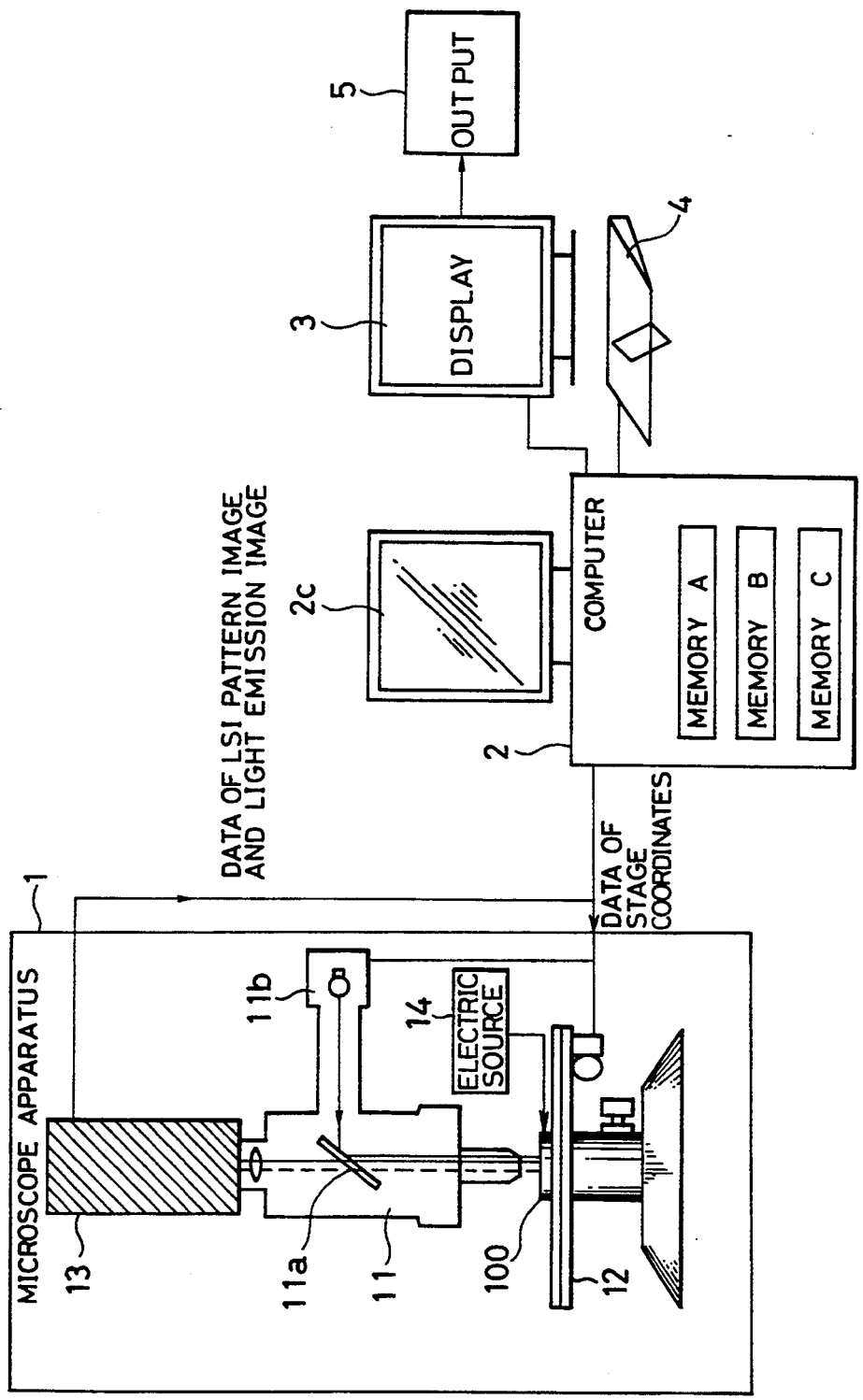
FIG. 1 is a schematic constructional view of a system for detecting a defective portion of a semiconductor element by use of an emission microscope as a first embodiment of the present invention.

In FIG. 1, an emission microscope system, as a first embodiment of the present invention, for detecting a defective portion of a semiconductor element, is provided with a microscope apparatus 1 and its peripheral apparatuses i.e. a computer 2, a display device 3, a tablet device 4, and an output device 5.

The microscope apparatus 1 is provided with an emission microscope 11, which includes a half mirror 11a and a light source 11b, and a stage 12, on which an LSI (Large Scale Integrated circuit) chip 100 as an example of the semiconductor element to be examined, is placed. The microscope apparatus 1 is also provided with a detector 13, and an electric source 14 which supplies the electric current to the LSI chip 100. These components are placed in a dark room where the external light is shut out. In the microscope apparatus 1, the optical path of the emitted light from the LSI chip 100 is indicated by a dotted line, while the optical path of the LSI pattern image is indicated by a solid line. The stage 12 is adapted to move by a driving device controlled by the computer 2.

The computer 2 is provided with a CPU (Central Processor Unit), and various memories including a memory A for storing a background noise of the detector 13, a memory B for storing a LSI pattern image data, and a memory C for storing the light emission image data. The computer 2 is adapted to control the microscope apparatus 1, the display device 3, the tablet device 4, and the output device 5, and also perform the image processing operation as described later in detail. The computer 2 is also provided with a display device 2c for displaying various information necessary for the operation.

The display device 3 is adapted to display the processed image data of the LSI pattern image and the light emission image, which are processed by the computer 2. The tablet device 4 is adapted such that the operator can input some operation commands, and point out a desirable position of the displayed image on the screen of the display device 3.

The output device 5 is adapted to output the result of the detecting operation as a hard copy of image data, for example, The microscope apparatus 1 is adapted to illuminate the LSI circuit 100 set on the stage 12 by use of the light source 11b, read the image on the surface of the LSI chip 100 by use of the detector 13, and output the LSI pattern image data to the computer 2. The microscope apparatus 1 is also adapted to collect the emission light from the LSI chip 100 which is emitted from the defective portion of the LSI chip 100 while the electric source 14 supplies the electric current to the LSI chip 100.

In this manner, the LSI pattern image data of the LSI chip 100 and the light emission image data of the light emission due to the defect of the LSI chip 100, are obtained by the detector 13 and outputted to the computer 2.

The computer 2 performs the image data processing operation as described later in detail to detect the light emission portion, and generates a control signal i.e. the stage coordinates data for controlling the relative position of the stage 12 with respect to the detector 13, and outputs it to the microscope apparatus 1 so as to move the stage 12 correspondingly.

Figure 2:
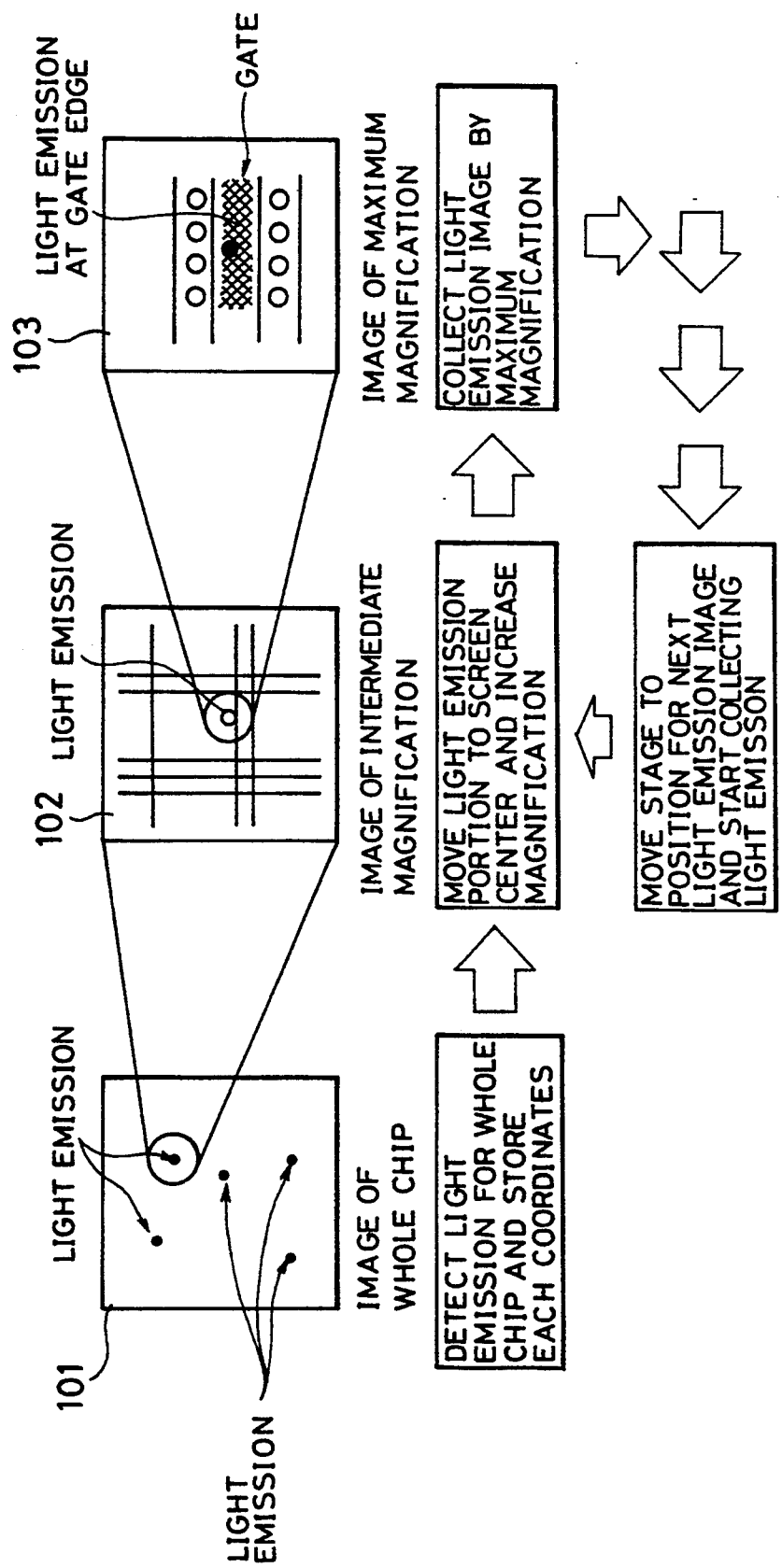
FIG. 2 is a schematic explanation view of the detecting method of the detecting system of FIG. 1.

FIG. 2 shows chip surface images 101 to 103 of the LSI chip 100 during one series of the detecting operation of the emission microscope system of FIG. 1, in which the magnification of the emission microscope 11 is sequentially increased in the order of 101 to 103, with the summarized operation flow diagram corresponding to these chip surface images 101 to 103.

In FIG. 2, the chip surface image 101 is firstly obtained with the minimum magnification of the emission microscope 11, so that all light emissions can be observed as for the whole chip surface of the LSI chip 100. At this time, the coordinates of each light emission portion are stored into the computer 2.

Then, the computer 2 directs the microscope apparatus 1 to move the stage 12 so that one light emission portion is moved to the view center of the emission microscope 11, namely to the screen center of the display device 3 and to increase the magnification. Thus, the chip surface image 102 by the intermediate magnification is obtained.

Then, the magnification is further increased to be the maximum value, so that the chip surface image 103 is obtained. At this time, the light emission image at the gate edge, is collected by the emission microscope 11 and stored into the memory C of the computer 2.

Then, according to the memorized coordinates data of each light emission portion in the computer 2, the stage 12 is moved so that another light emission portion is moved to the view center of the emission microscope 11, and the light emission collecting operation is resumed by the microscope apparatus 1.

This defective portion detecting operation is explained in more detail, with referring to FIGS. 3 to 7, which are the flowcharts of the operation of the emission microscope system of FIG. 1. Here, FIG. 3 generally shows the processes for detecting the LSI pattern image.

Figure 3:
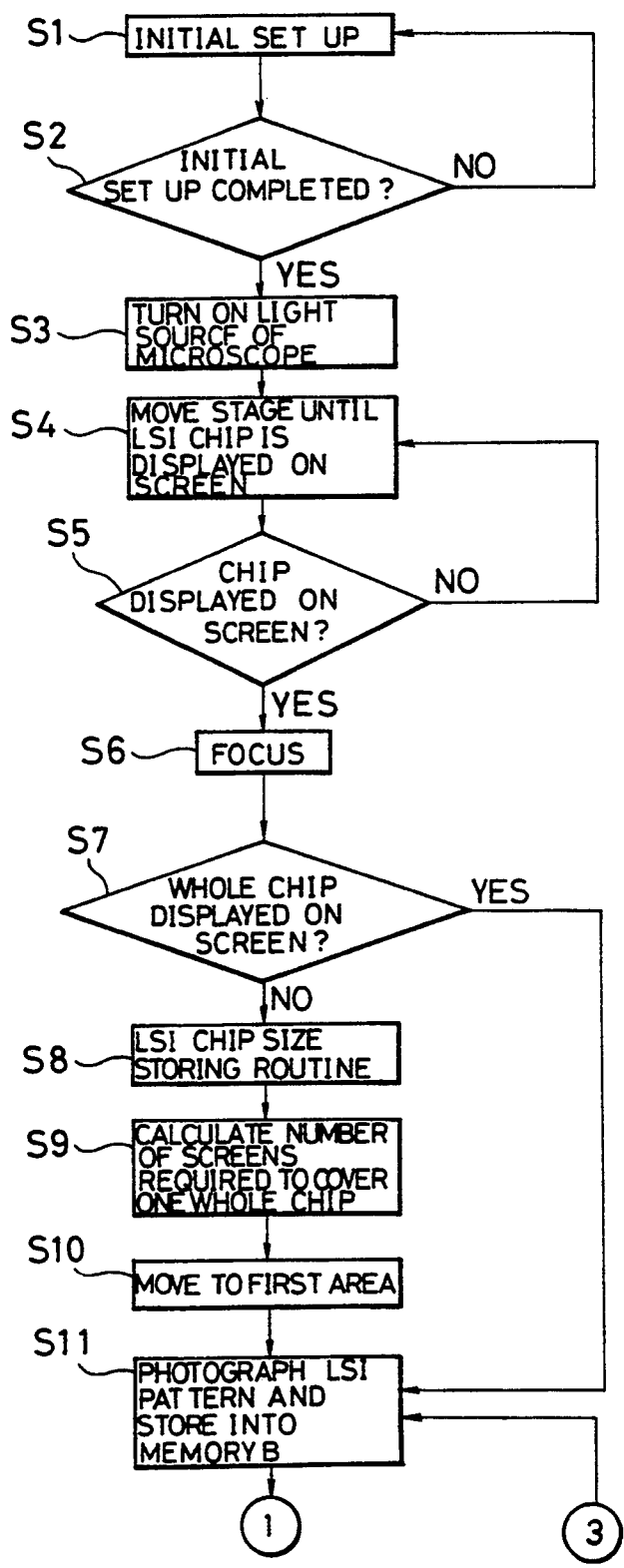
FIG. 3 is a flowchart showing a first portion of the operation of the detecting system of FIG. 1.

In FIG. 3, at first, the initial set up process is performed (step S1). The detailed content of this initial set up process is shown in FIG. 6.

Figure 6:
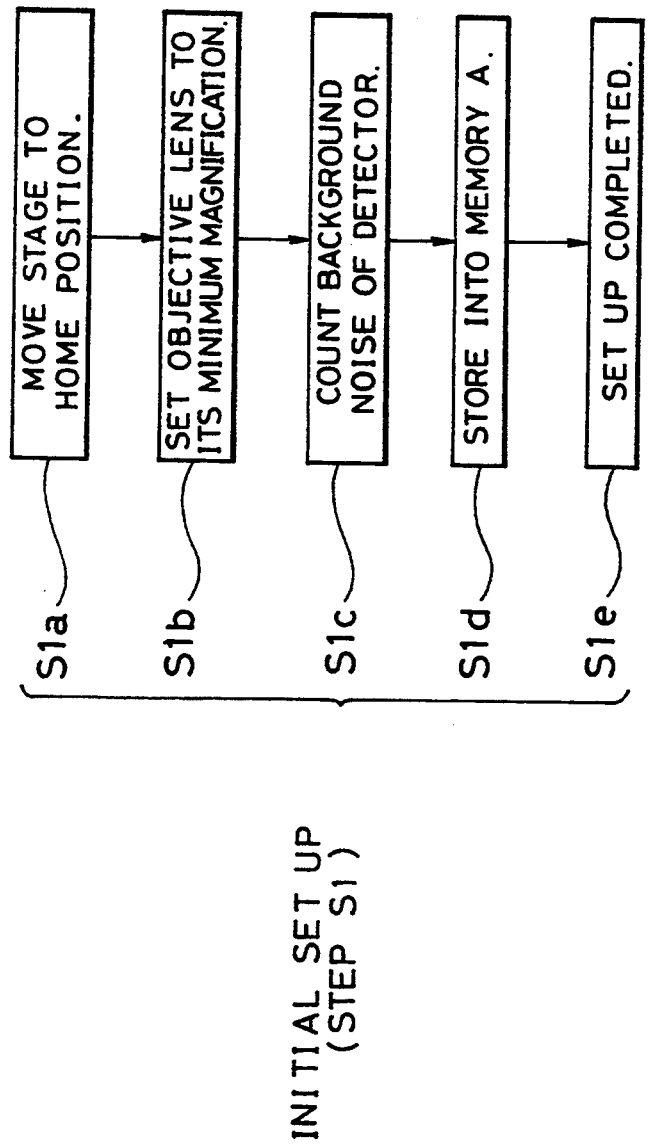
FIG. 6 is a flowchart showing an initial set up step in the operation of FIG. 3.

In FIG. 6, the stage 12 is firstly moved to its home position (step S1a), and the objective lens of the emission microscope 11 is set to its minimum value (step S1b). Then, the background noise of the detector 13 is counted by the computer 12 (step S1c). The counted background noise is stored into the memory A of the computer 2 (step S1d), and the initial set up process is completed (step S1e).

Then, in FIG. 3 again, it is judged if the above mentioned initial set up process is completed or not (step S2). When it is judged that the set up process is completed, the flow branches to the step S3, where the light source 11b of the emission microscope 11 is turned on under the control of the computer 2, and the LSI chip 100 is set on the stage 12 (step S3).

Then, the stage 12 is moved under the control of the computer 2, until the LSI chip 100 is displayed on the screen of the display device 3 (step S4), while it is checked if the LSI chip 100 is displayed on the screen or not (step S5).

When the LSI chip 100 is displayed at the step S5, the flow branches to the step S8, where the focus of the emission microscope 11 is established with respect to the surface of the LSI chip 100 (step S6).

After the focusing operation is completed, it is checked if the whole chip surface of the LSI chip 100 is displayed on the screen or not (step S7) (while the magnification of the emission microscope 11 is set to its minimum value at the step S1). If the whole chip surface is displayed (YES), the flow branches to the step S11, where the LSI pattern image of the LSI chip 100 is photographed and stored into the memory B of the computer 2. More particularly, the image data is collected by each pixel i.e. each picture element of the detector 13, and then the light strength data per each pixel as well as its coordinates data are stored into the memory B (step S11).

At the step S7, if the whole chip surface is not displayed (NO), the flow branches to the step S8, where the LSI chip size storing routine is executed. This LSI chip size routine is executed to enable a dividing display method to cover the whole chip image of the LSI chip 100 by dividing the whole image into a plurality of image areas, and its detailed content is shown in FIG. 7.

Figure 7:
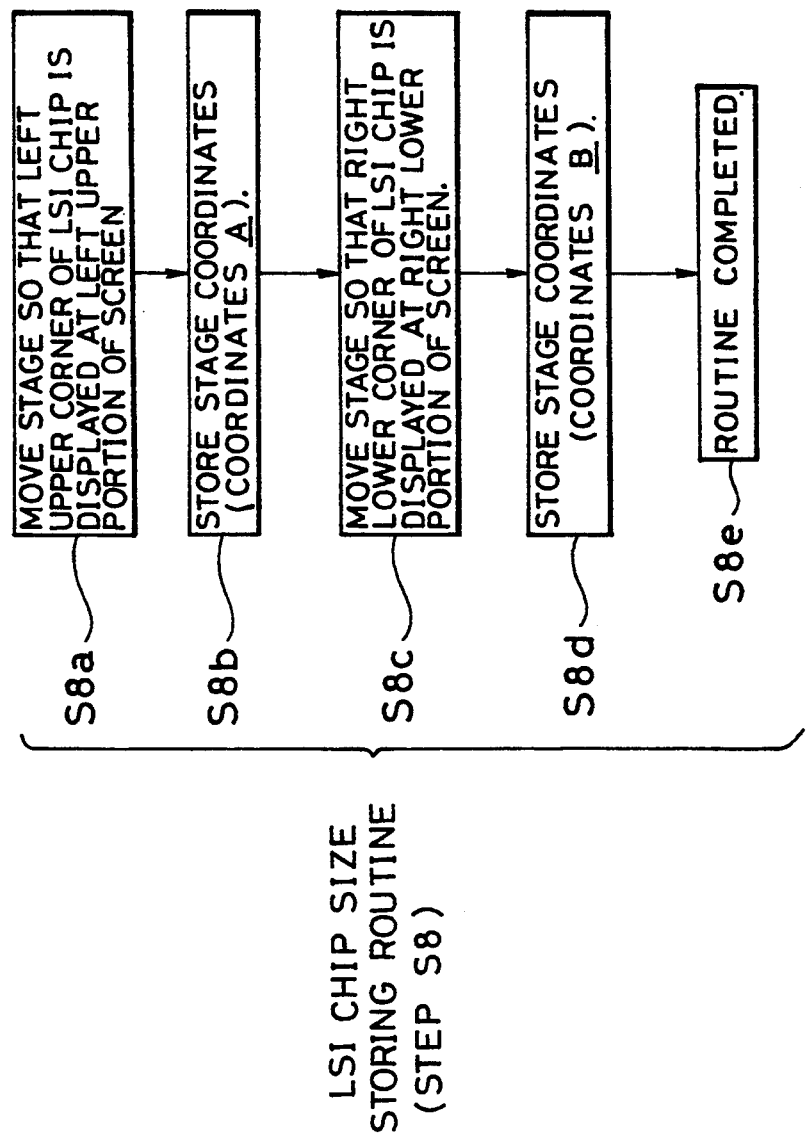
FIG. 7 is a flowchart showing a LSI chip size storing routine step in the operation of FIG. 3.

In FIG. 7, at first, the stage 12 is moved under the control of the computer 12, so that the left upper corner of the LSI chip 100 is displayed at the left upper portion of the screen of the display device 3 (step S8a). The coordinates of the stage 12 are stored as the coordinates A (step S8b). Then, the stage 12 is moved so that the right lower corner of the LSI chip 100 is displayed at the right lower portion of the screen of the display device 3 (step S8c). The coordinates of the stage 12 are stored as the coordinates B (step S8d), and the LSI chip storing routine is completed (step S8e). In this manner, at least the coordinates of the opposed corners of the LSI chip 100 are detected.

Then, in FIG. 3 again, after this routine of the step S8 is completed, the computer 2 calculates the number of screens required to cover one whole chip surface of the LSI chip 100 (step S9). Then, the stage 12 is moved to the first area (step S10) as one divided portion of the whole area to be examined, and the flow goes to the aforementioned step S11, and the LSI pattern photographing operation is executed (step S11).

Figure 4:
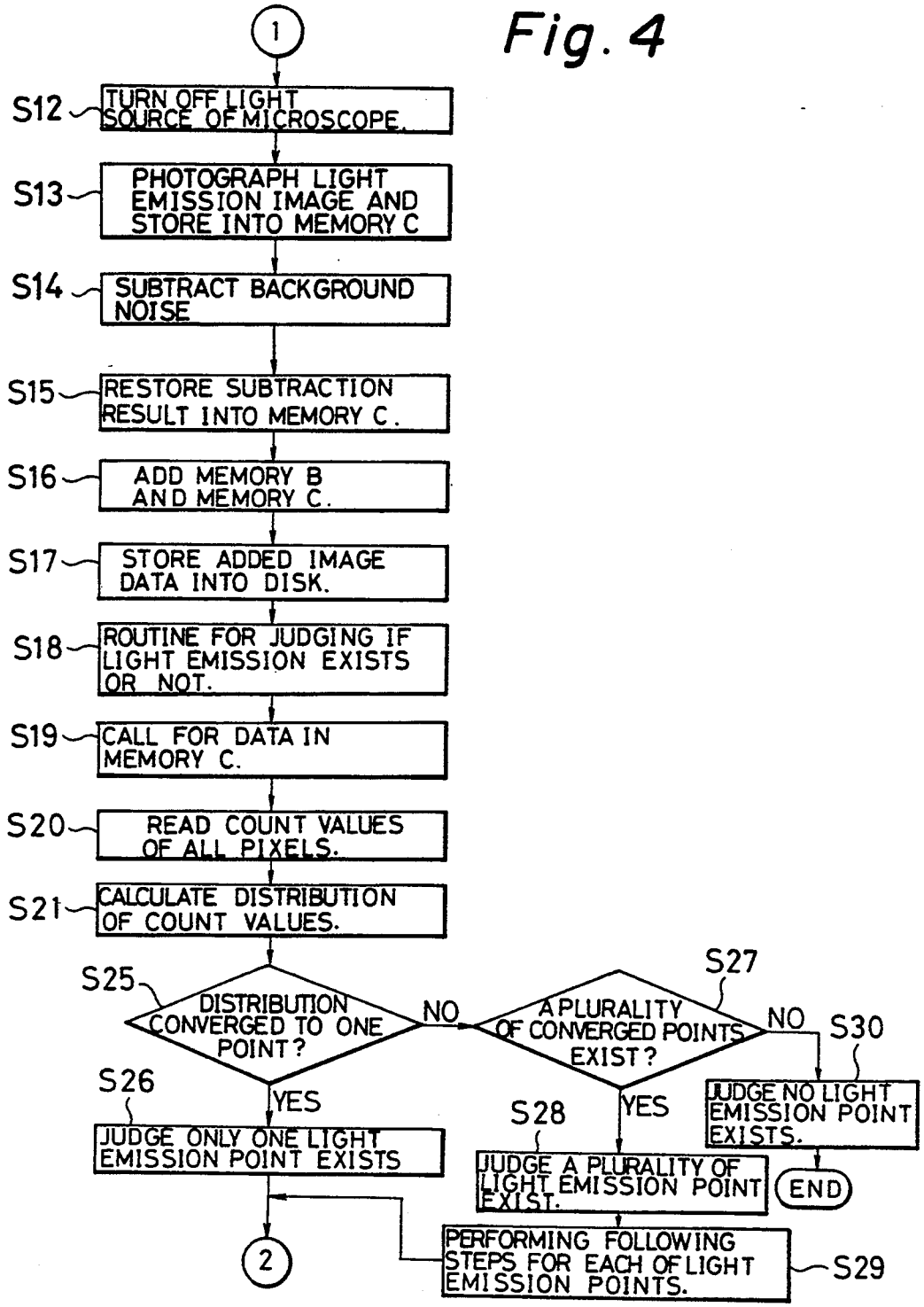
FIG. 4 is a flowchart showing a second portion of the operation of the detecting system of FIG. 1.

Then, the flow goes to the step S12 in FIG. 4. Here, FIG. 4 generally shows the processes for detecting the light emission image.

In FIG. 4, the light source 11b of the emission microscope 11 is turned off and the LSI chip 100 is supplied with the electric current (step S12). Here, the light emission image of the LSI chip 100, including any defective portion light to be detected, is photographed, such that the image 101 of the whole chip shown in FIG. 2 is obtained. More particularly, the light strength at each pixel of the detector 13, is detected and stored with its coordinate data into the memory C of the computer 12 (step S13). Then, in the computer 2, the background noise data, stored in the memory A at the step S1, is subtracted from the detected light strength data, stored in the memory C at the step S13. In this manner the subtraction result (memory C−memory A) is obtained per each pixel by the computer 12 (step S14), and is restored into the memory C (step S15).

At this time, the computer 12 determines the portion at which the subtracted pixel value is not "0", which is the light emission portion. The data in the memory B and the corresponding data in the memory C are added (step S16) and the added image data is stored, as the observed image data for the whole chip of the LSI chip 100, into a disk by use of the disk driving device associated with the computer 2 (step S17).

Here, in order to judge if the detected light emission is from just one point or from a plurality of points, the routine for judging if the light emission exists or not (step S18) is executed. At this time, the image data in the memory C of the computer 2 is called (step S19), and the count values of all pixels are read (step S20). Then, the distribution of these count values are calculated (step S21). Step designations S22–S24 are not utilized). After these distributions are obtained, the computer 2 checks if each calculated distribution is converged to one point or not (step S25). Namely, it is determined whether or not only one light emission point exists. If it is converged to one point (YES), the flow branches to step S26, where it is judged that there is only one light emission point.

On the other hand, at the step S25, if it is not converged to one point (NO), the flow branches to the step S27, where it is further determines whether a plurality of converged points exists. If there exist a plurality of converged points (YES), the flow branches to the step S28, where it is judged whether there are a plurality of light emission points. Then, the proceeding steps are executed for all of these detected light emission points, respectively (step S28).

On the other hand, at the step S27, if there are not a plurality of converged points (NO), the flow branches to the step S30, where it is judged that there exists no light emission point, and the processes are ended with the conclusion that there exists no defective portion in the examined LSI chip 100.

Figure 5:
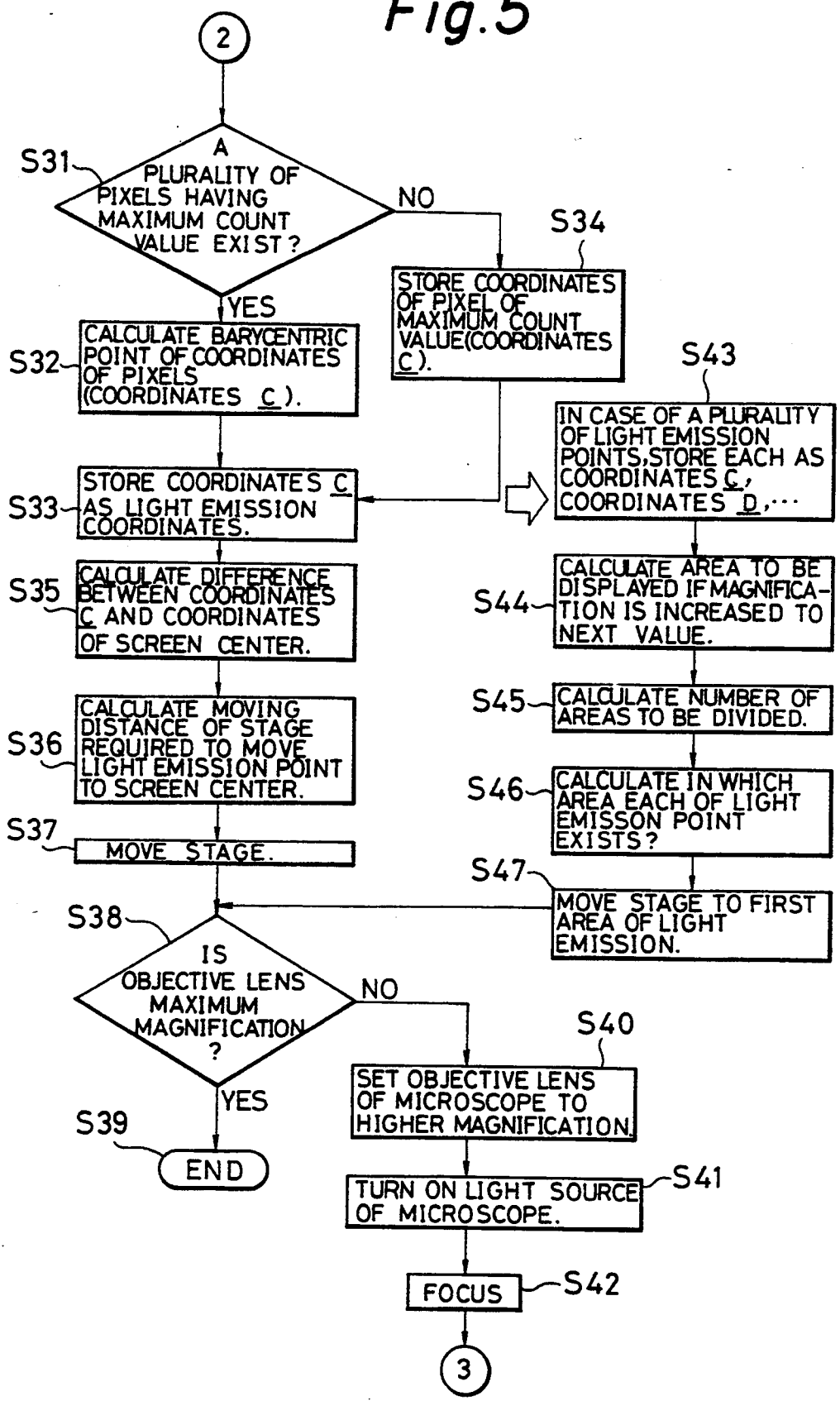
FIG. 5 is a flowchart showing a third portion of the operation of the detecting system of FIG. 1.

In this manner, the positional information as for the light emission points is obtained by the aforementioned steps of FIG. 4. At this time, it is quite normal to encounter the case that the light emission points obtained at the steps S26 and S29, are composed of a plurality of pixels of the detector. Accordingly, the flow goes from the steps S26 and S29 of FIG. 4, to the step S31 of FIG. 5, so as to deal with the case where a plurality of pixels forms one light emission point. FIG. 5 generally shows the processes for moving the stage 12 in a prescribed manner so as to obtain the final detection result.

In FIG. 5, firstly, it is judged if there exists a plurality of pixels having the maximum count value, or not (step S31). If exists (YES), the flow branches to the step S32, where the barycentric point of coordinates of the pixels, is calculated to be a coordinates C (step S32). Thus calculated coordinates C are assumed as the light emission position in relation to the stage coordinates (step S33).

On the other hand, at the step S31, if the determination is NO, the flow branches to the step S34, where the coordinates of the pixel having the maximum count value is determined to be the coordinates C to be stored (step S34). Then, coordinates C are stored as the light emission coordinates (step S32).

Then, the difference between the coordinates C and the coordinates of the view center of the emission microscope 11, is calculated (step S35), and further, the moving distance of the stage 12 to move the light emission point i.e. the coordinates C to the view center, is calculated by the computer 2 (step S36). The stage 12 is actually moved according to this calculated moving distance under the control of the computer 2 (step S37).

Accordingly, a display condition where the light emission portion is centralized in the screen of the display device 3, can be obtained. Here, it is checked if the magnification of the objective lens of the emission microscope 11 is an appropriate value or not, for example, whether the magnification is the maximum value (step S38). If the magnification is maximum (YES), the operation is ended while the final image data result of the examined LSI chip 100 is obtained.

On the other hand, at the step S38, if the magnification is not maximum (NO), the flow branches to the step S40, where the objective lens of the emission microscope 11 is set to a higher magnification under the control of the computer 2 (step S40), since there is a possibility that a higher magnification can be available for the relevant detection such as to obtain a higher resolution result. Then, the light source 11$b$ of the emission microscope 11 is turned on (step S41) and the focusing procedure is executed again (step S42). Then, the flow goes back to the step S11 in FIG. 3, and the above described processes after the step S11 are repeated with the higher magnification.

On the other hand, if there exist a plurality of light emission points, as for each of these light emission points, the barycentric point is calculated, and the calculated coordinates of each baryocentric point, i.e. the coordinates C. the coordinates D. . . . are stored (step S43).

Figure 8:
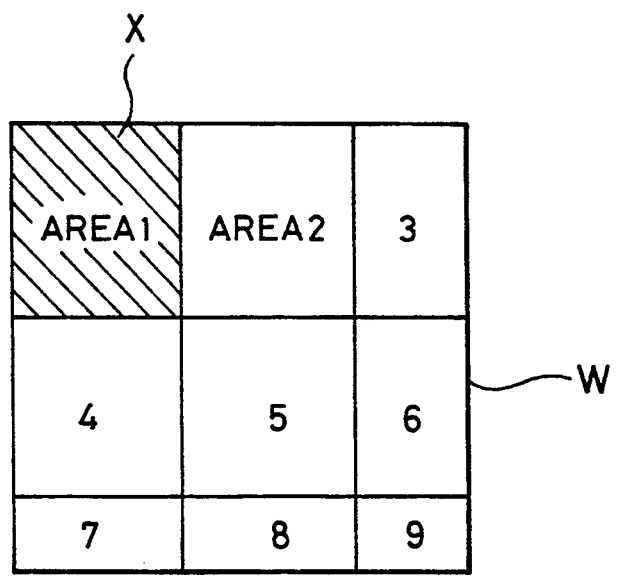
FIG. 8 is a schematic plane view of the screen of the display device of FIG. 1.

At this time, if two or more light emission points are still within a same view even after the increase of the magnification, these light emission points are processed as one group. For this purpose, at the step S44, as shown in FIG. 8, the hatched area X i.e. the area 1, which is to be displayed after the increase of the magnification, is calculated with respect to the currently displayed area W (which includes the areas 1, 2, . . . , 9) (step S44). Then, the number of areas to be divided after the increase of the magnification, is also calculated (step S45).

Then, it is further calculated in which area each of the light emission points is included (step S46). The stage 12 is moved under the control of the computer 2 to the first area in which the light emission point exists (step S47), and the flow goes to the step S38.

In this manner, by making a plurality of the light emission points into one group, these points can be dealt within the same displayed area, so that the inefficiency and duplicated work to observe the same display image again and again, can be avoided according to the first embodiment.

In the above described processes, not only the image data corresponding to the maximum magnification, but also any observed image data which may be useful for the evaluation of the LSI chip 100, can be transferred from the computer 2 to the output device 3, and outputted therefrom as a hard copy, for example.

As described above in detail, according to the first embodiment, since the image of the whole chip surface of the LSI chip 100, is photographed by a low magnification, and since the information as for the position of the defect is stored into the computer 2, while the detection of the defective portion is conducted with gradually increased magnification based on the stored information, the detecting operation can be easily and automatically performed. At this time, when the magnification is increased, it is not necessary for the operator to search the image to be checked which is out of the screen of the display device 3 as in the case of the aforementioned related art technique, resulting in the remarkable decrease in time and labor of the operation of detecting the defective portion of the LSI chip 100.

The second embodiment of the present invention will be explained hereinbelow, with referring to FIGS. 9 and 10.

Figure 9:
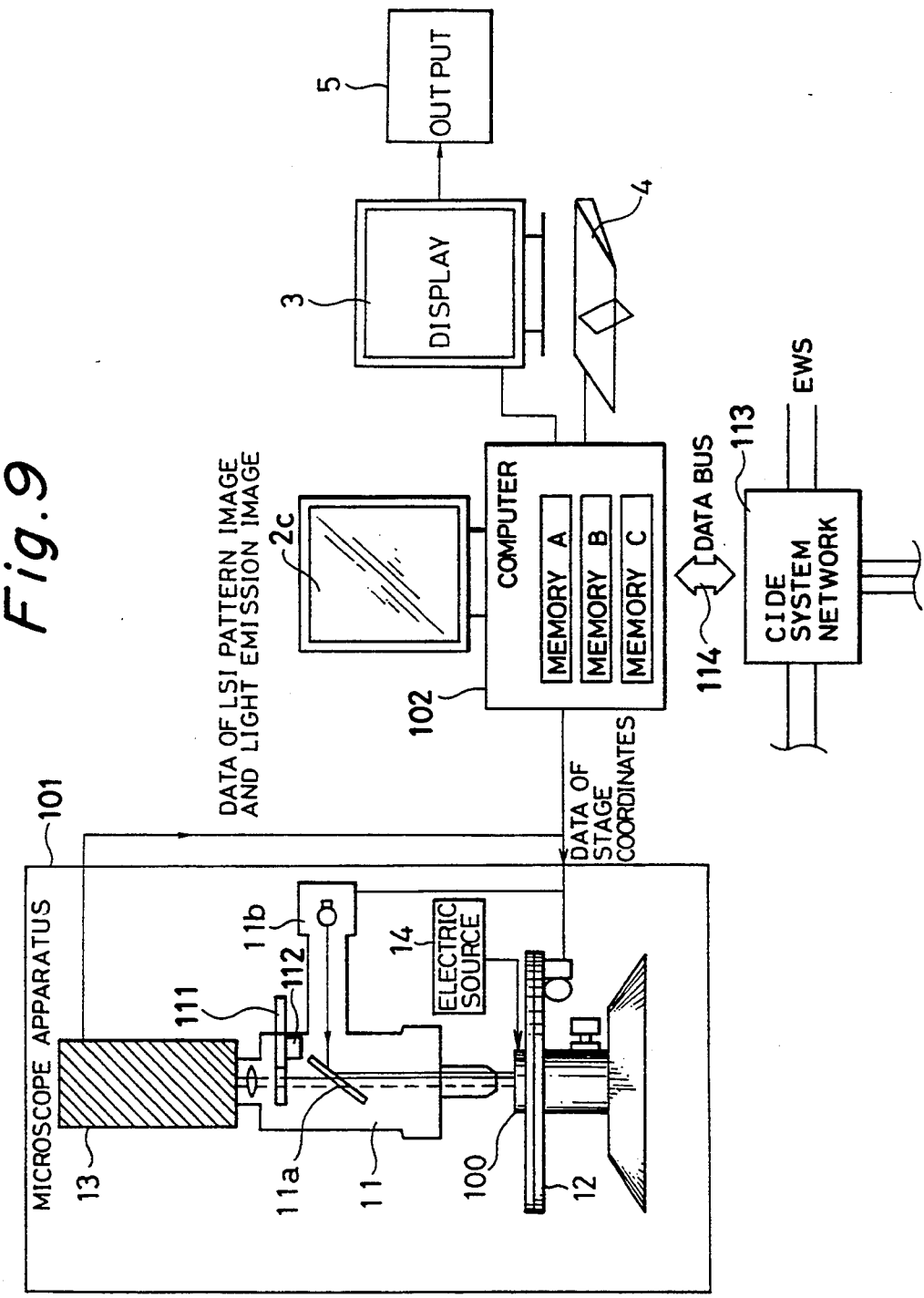
FIG. 9 is a schematic constructional view of a system for detecting and analyzing a defective portion of a semiconductor element by use of an emission microscope as a second embodiment of the present invention.

FIG. 9 is a schematic constructional view of the second embodiment, wherein the same constructional elements as those in the above explained first embodiment of FIG. 1, carry the same reference numerals and the explanations thereof are omitted.

In FIG. 9, the detecting system is provided with a microscope apparatus 101, and a computer 102. The microscope apparatus 101 includes a spectrum filter device 111 having a plurality of spectrum filters, each of which has a different wavelength range of light transmission, for separating a light into its spectrum components and a motor 112 for driving the spectrum filter device 111.

In order to improve the precision for the automatic recognition of the light emission, it is desirable to make the whole body of the microscope apparatus 101 shielded by a dark room, and to put the microscope apparatus 101 on the vibration-isolating stage. The spectrum filter device 111 disposed in the optical path of cylindrical shape, enables the spectrum analysis of the light received by the detector 13. By obtaining the data showing which range of wavelength is predominantly included in the light in each pixel received by the detector 13, the judgment as for the cause of the defect in the LSI chip 100 can be improved with respect to each pixel, and the detailed information as for the shape etc., of the defective portion of the LSI chip 100 can be also obtained.

These spectrum filters included in the spectrum filter device 111 are automatically and sequentially changed one after another by the motor 112, such that the wavelength range of the spectrum filter device 111 corresponds to the detecting wavelength range of the detector 13. By this spectrum analysis, the noises having specific wavelengths in the observed image data can be efficiently distinguished from the light emissions to be detected which have a spectrum different from that of the noises, in the manner described below.

The computer 102 includes a CPU to perform an image data analytical program, and a program memory for storing the program as well as the memories A, B, and C. The computer 102 is adapted to recognize and integrate the light emissions, and also adapted to distinguish the light emissions from the noises in the image data obtained by the microscope apparatus 101 with respect to each observed pixel, by calculating the average value $\mu$ and the variance $\sigma$ of the normal distribution of the image data stored in the memory C, and by setting the value of $\mu + \sigma$ as the boundary value between the light emission and the noise, according to the program stored in the program memory.

The computer 102 is further adapted to transmit the observed image data to an external apparatus for analyzing the data, such as a CIDE (Computer Integrated Design and Evaluation) system 113 via the data bus 114, and receive various control data from the CIDE system 113 via the data bus 114, so as to establish the network system for the design and evaluation of the LSI chip 100, wherein an EWS (Engineering Work Station) may be also connected to the computer 102 in the network via the CIDE system 113 and the data bus 114.

The defective portion detecting and analyzing operation by the thus constructed second embodiment is explained hereinbelow, with reference to FIG. 10, which is a flowchart of the operation of the emission microscope system of FIG. 9. In FIG. 10, the same steps as those in the first embodiment of FIG. 4, carry the same reference numerals and the explanation thereof is omitted.

In the detecting method of the second embodiment, the step S114 is performed in place of the step S14 of the first embodiment. Otherwise, the steps of the detecting method in the second embodiment are same as those in the first embodiment, as shown in FIGS. 3 to 7.

Thus, the light emission data are collected by the emission microscope 11 and are stored into the memory C by the steps S1 to S13.

Figure 10:
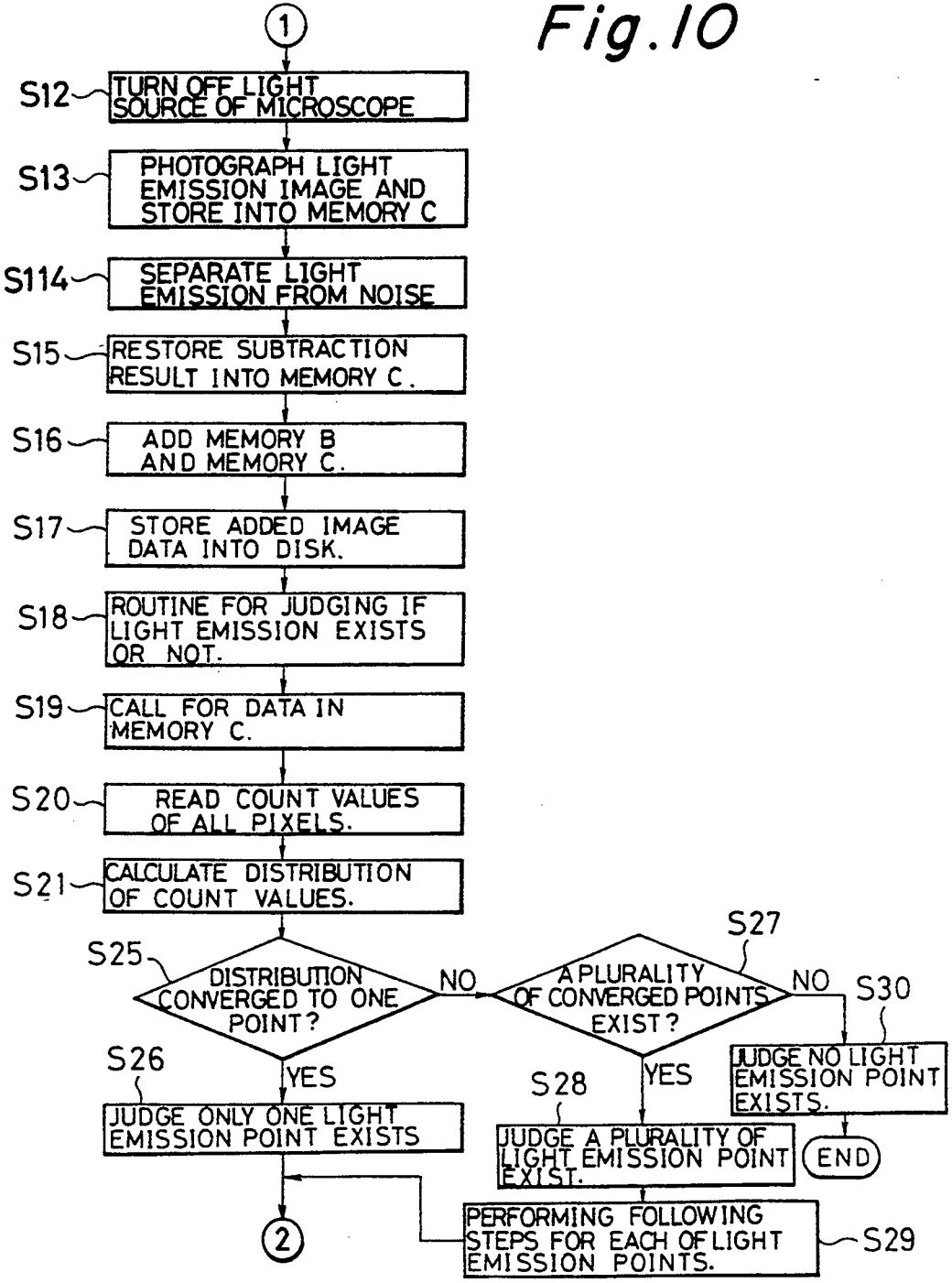
FIG. 10 is a flowchart showing the operation of the detecting and analyzing system of FIG. 9.

Here at the step S114 of FIG. 10, the computer 102 calculates the average value $\mu$ and the variance $\sigma$ of the normal distribution in the data values stored in the memory C, i.e. the light emission image data collected by the emission microscope 11, and further calculates the value of $\mu + \sigma$. Then, the image data value of each pixel, which is not greater than the thus calculated value of $\mu + \sigma$, is replaced by the value "0", as the recognized noise data. In this manner, the computer 102 separates the light emissions from the noises in the image data by judging that the pixel having the value greater than "0" is the portion of the light emission to be detected (step S114).

Then, the image data of all pixels, in which the light emissions are distinguished from the noises, are restored into the memory C at the step S15, and the following steps S16, S17, . . . , are performed.

In the second embodiment, thus obtained data as for the defective portions of the LSI 100, are transported from the computer 102 to the CIDE system 113 via the data bus 114 as shown in FIG. 9, and are further processed thereat as one of the unified evaluation data with other various kinds of evaluation data such as simulation data, LSI (Large Scale Integrated circuit) tester data, electron beam tester data and so on. This unified evaluation data processes bring an advantage to deal speedily with the analysis for the cause of the defect, and to find out the countermeasure to overcome thus analyzed cause of the defect. As one example of such a countermeasure, it is effective to change the circuit layout of the LSI chip 100 for the next design. It is also advantage of the present embodiment, that the thus acquired data can be utilized for prescribing the rule of the CAD (Computer Aided Design) and also as the data for the device process simulation. This kind of detailed analysis of the light emission characteristic, is helpful to the reliability evaluation of the device, i.e. helpful to the study for finding out the causes of defect in relation to the activation energy on the Arrehenius plot of the defective generation and the light emission phenomena.

As described above in detail, according to the second embodiment, since the recognition of the light emission is automatically performed while distinguishing the light emission portions from the noises, the difference in the observation result due to the individual variations, can be made quite little or nil, and thus there is little possibility to miss or overlook the light emission portion. In this manner, the analysis for the light emission can be substantially performed without the necessity of the human intervention as in the case of the related arts, and a very objective result of the analysis can be automatically and speedily obtained. Consequently, the industrial value of the present embodiment is quite large in advancing the field of semiconductor analyzing technique.

Many widely different embodiments of the present invention may be constructed without departing from the spirit and scope of the present invention. It should be understood that the present invention is not limited to the specific embodiments described in this specification, except as defined in the appended claims.

What is claimed is:

1. A method of detecting a defective portion of a semiconductor element, comprising the steps of:

setting a semiconductor element on a stage of an emission microscope;

setting a magnification of said emission microscope low and observing a surface of said semiconductor element by said emission microscope while an electric power is supplied to said semiconductor element;

storing a positional information of at least one light emission portion of said semiconductor element observed by said emission microscope;

moving said stage on the basis of said stored positional information so that one light emission portion is moved to a view center of said emission microscope;

increasing said magnification and collecting a light emission image of said one light emission portion by said emission microscope, said magnification being gradually increased to such a value as to collect said light emission image with a desirable scale; and moving said stage on the basis of said stored positional information so that another light emission portion is moved to said view center so as to collect a light emission image of said another light emission portion by said emission microscope.

2. A method according to claim 1, wherein said positional information is stored into a memory of a computer connected with said emission microscope at the storing step, and said stage is moved under the control of said computer at the moving steps.

3. A method according to claim 1, wherein a whole surface of said semiconductor element is observed at the observing step.

4. A method according to claim 1, wherein said magnification is set to the minimum value of said emission microscope at the magnification setting step, and said magnification is increased to the maximum value of said emission microscope at the image collecting step.

5. A method according to claim 1, wherein if said one light emission portion is observed by a plurality of pixels adjacent to each other of said emission microscope at the observing step, a barycentric point of said pixels is calculated to be said positional information.

6. A method according to claim 1, wherein a background noise of said emission microscope is counted before the setting step, and said collected emission light image is compensated with said counted background noise.

7. A method according to claim 1, further comprising the step of illuminating said semiconductor element by said emission microscope and collecting a circuit pattern image of said illuminated semiconductor element.

8. A method according to claim 7, wherein said collected circuit pattern image and said collected light emission image are overlapped to form an image data of a detection result.

9. An apparatus for detecting a defective portion of a semiconductor element, comprising:
a movable stage on which a semiconductor element is set;
an electric source for supplying an electric power to said semiconductor element;
an emission microscope, which magnification is continuously changeable, for observing a surface of said semiconductor element and collecting an image of said semiconductor element;
a control means for directing said emission microscope to observe said surface of said semiconductor element with setting said magnification low while said electric source supplies said electric power, storing a positional information of at least on light emission portion observed by said emission microscope, directing said stage to move on the basis of said stored positional information so that one light emission portion is moved to a view center of said emission microscope, directing said emission microscope to increase said magnification and collect a light emission image of said one light emission portion, directing said stage to move on the basis of said stored positional information so that another light emission portion is moved to said view center, and directing said emission microscope to collect another light emission image of said another light emission portion.

10. A method of analyzing a defective portion of a semiconductor element, comprising the steps of:

setting a semiconductor element to an emission microscope;
collecting a light emission image of a light emission portion of said semiconductor element by said emission microscope with a certain amount of noise while an electric power is supplied to said semiconductor element, so as to generate image data corresponding to said collected light emission image and said noise;
inputting said generated image data to a processing device;
recognizing said light emission portion by distinguishing image data corresponding to said light emission portion from image data corresponding to said noise, by said processing device; and
storing said recognized light emission portion into a memory device in such a manner that said recognized light emission portion can be tracked or accessed when it is desired.

11. A method according to claim 10, wherein said recognizing step comprises the step of processing said inputted image data with respect to each pixel of said emission microscope, by said processing device.

12. A method according to claim 11, wherein said processing step comprises the steps of:
integrating light emissions indicated by said inputted image data with respect to said each pixel for a predetermined time period;
calculating average value $\mu$ and a variance $\sigma$ of a normal distribution of data values of said pixels; and
distinguishing said image data by use of a value of $\mu + \sigma$ as a boundary between said light emission and said noise.

13. A method according to claim 10, wherein said collecting step is performed by use of a plurality of spectrum filters of different wavelengths so as to generate said image data with respect to each different wavelength.
said method further comprising the step of analyzing the wavelength of the light of said collected light emission image.

14. An apparatus for analyzing a defective portion of a semiconductor element, comprising:
a movable stage on which a semiconductor element is set;
an electric source for supplying an electric power to said semiconductor element;
an emission microscope, which magnification is changeable, for collecting an image of said semiconductor element and generating image data corresponding to said collected image, said emission microscope being provided with a spectrum filter device including a plurality of spectrum filters each having a different wavelength range of light transmission, and a driving device for driving said spectrum filter device to place said spectrum filter one after another in a sequential manner to an optical path of said emission microscope; and
a computer, to which said generated image data are inputted, having a memory device for statistically processing said inputted image data, and controlling the position of said movable stage and the magnification of said emission microscope according to the result of statistical process.

15. An apparatus according to claim 14, wherein said computer is provided with a data bus through which data can be transmitted and received by said computer.

* * * * *